(12) United States Patent
Yamamoto et al.

(10) Patent No.: US 9,196,580 B2
(45) Date of Patent: Nov. 24, 2015

(54) SEMICONDUCTOR DEVICE AND SEMICONDUCTOR PACKAGE CONTAINING THE SAME

(71) Applicant: LAPIS SEMINCONDUCTOR CO., LTD., Yokohama (JP)

(72) Inventors: Hiroshi Yamamoto, Tokyo (JP); Eiji Takeichi, Tokyo (JP)

(73) Assignee: LAPIS SEMINCONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/164,298

(22) Filed: Jan. 27, 2014

(65) Prior Publication Data

US 2014/0138820 A1 May 22, 2014

Related U.S. Application Data

(62) Division of application No. 11/939,734, filed on Nov. 14, 2007, now abandoned.

(30) Foreign Application Priority Data

Nov. 28, 2006 (JP) ................. 2006-319417

(51) Int. Cl.
*H01L 23/48* (2006.01)
*H01L 23/498* (2006.01)
(Continued)

(52) U.S. Cl.
CPC ...... *H01L 23/49811* (2013.01); *H01L 23/3157* (2013.01); *H01L 24/10* (2013.01); *H01L 24/13* (2013.01); *H01L 23/528* (2013.01);
(Continued)

(58) Field of Classification Search
CPC .......... H01L 2924/13099; H01L 2924/01002; H01L 2924/01005; H01L 2924/01013; H01L 2924/01015; H01L 2924/01022; H01L 2924/01029; H01L 2924/01033; H01L 2924/01078; H01L 2924/01079; H01L 2924/01082; H01L 2924/14; H01L 2924/01006; H01L 2924/01047; H01L 2924/014; H01L 2924/00; H01L 23/3157; H01L 23/49811; H01L 23/528; H01L 24/13; H01L 24/10; H01L 24/86; H01L 2224/13099
USPC ............ 257/778–786, 737, E23.01, E23.116
See application file for complete search history.

(56) References Cited

U.S. PATENT DOCUMENTS 5,220,199 A * 6/1993 Owada et al. ................. 257/773
5,744,859 A 4/1998 Ouchida
(Continued)

FOREIGN PATENT DOCUMENTS

JP 63-318742 12/1988
JP 03-038043 2/1991
(Continued)

*Primary Examiner* — Shaun Campbell
(74) *Attorney, Agent, or Firm* — Volentine & Whitt, PLLC

(57) ABSTRACT

A semiconductor device, having an electrode pad as a part of wirings on the uppermost layer thereof, includes a passivation film and a bump electrode for external connection. The passivation film is formed on the electrode pad, and the bump electrode is formed on the passivation film and electrically connected to the electrode pad. The electrode pad is formed so as to be smaller in size than the bump electrode, and parts of the wiring on the uppermost layer are formed under the bump electrode. In this manner, it is possible to utilize the area under the bump electrode effectively without sacrificing flatness of the passivation film. As a result, the semiconductor device and the semiconductor package can be made smaller.

9 Claims, 6 Drawing Sheets

(51) Int. Cl.
*H01L 23/31* (2006.01)
*H01L 23/00* (2006.01)
*H01L 23/528* (2006.01)

(52) U.S. Cl.
CPC ...... *H01L 24/86* (2013.01); *H01L 2224/13099* (2013.01); *H01L 2924/01002* (2013.01); *H01L 2924/014* (2013.01); *H01L 2924/01005* (2013.01); *H01L 2924/01006* (2013.01); *H01L 2924/01013* (2013.01); *H01L 2924/01015* (2013.01); *H01L 2924/01022* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/14* (2013.01)

(56) References Cited

U.S. PATENT DOCUMENTS

| | | | |
|---|---|---|---|
| 5,989,940 | A | 11/1999 | Nakajima |
| 6,084,291 | A | 7/2000 | Fujimori |
| 6,118,180 | A | 9/2000 | Loo et al. |
| 2002/0043723 | A1* | 4/2002 | Shimizu et al. ............... 257/758 |
| 2006/0057834 | A1 | 3/2006 | Akagawa et al. |

FOREIGN PATENT DOCUMENTS

| | | |
|---|---|---|
| JP | 2002-198374 | 7/2002 |
| JP | 2006-041328 | 2/2006 |

* cited by examiner

SEMICONDUCTOR DEVICE AND SEMICONDUCTOR PACKAGE CONTAINING THE SAME

CROSS REFERENCE TO RELATED APPLICATION

This application is a Divisional Application of application Ser. No. 11/939,734, filed Nov. 14, 2007, which claims the priority of Application No. 2006-319417, filed Nov. 28, 2006 in Japan, the subject matter of which is incorporated herein by reference.

TECHNICAL FIELD OF THE INVENTION

The present invention relates to a semiconductor device having bump electrode as an external terminal, implemented with TCP (Tape Carrier Package) or COF (Chip On Film) technologies. More particularly, the present invention relates to an LCD (Liquid Crystal Display) driver package provided with a plurality of narrow-pitch bump electrodes.

BACKGROUND OF THE INVENTION

Upon assembling a product using the TCP implementation, a technology called TAB (Tape Automated Bonding) is used. On a main surface of a semiconductor chip, a bump electrode is formed as an external terminal, and the semiconductor chip is bonded to a film carrier with Inner-Lead Bonding (ILB). The film carrier has a long tape-like shape, on which repetitive wiring patterns are formed. The film carrier has device holes, each of which exposes an inner lead, and outer leads, and is automatically conveyed for each device hole. The semiconductor chip is aligned with a given position of the device hole, and the bump electrode thereof is bonded to the inner lead on the film carrier using a technology such as a thermal compression bonding process. Subsequently, the outer leads are bonded to key points on the semiconductor chip.

FIGS. 1A and 1B are a plan view and a cross-sectional view, respectively, of a conventional semiconductor device, showing a structure around a bump electrode thereof. A semiconductor device 12 includes a semiconductor chip 11 and an electrode pad 22. The semiconductor chip 11 further includes a plurality of wiring layers (not shown diagrammatically) that are insulated from each other with inter-layer insulating films. The electrode pad 22 is provided as a part of the wirings at the uppermost layer. A passivation film 24, having an opening, which is smaller in size than the bump electrode 14, which is to be explained hereinafter, is provided on the electrode pad 22. An under-bump metal 23 is formed on the passivation film 24, and connected to the electrode pad 22 through the opening thereof. The bump electrode 14 is connected to the electrode pad 22 via the under-bump metal 23. An inner lead 18 of a film carrier is connected to the bump electrode 14 by a thermal compression bonding process.

To keep the passivation film 24 flat, the electrode pad 22 is kept larger in dimension than the bump electrode 14. Therefore, the bump electrode 14 completely overlaps with the electrode pad 22.

Japanese Patent Number 2919488 discloses a technology related to the present invention.

Recently, as the miniaturization of the semiconductor chip has progressed, the electrode pad has come to occupy a large portion of the chip footprint, leading to reduced competitiveness in cost. However, it has been difficult to reduce the size of the bump electrode itself while ensuring a sufficient area for contact thereof with the inner lead.

In the conventional semiconductor device as shown in FIG. 1, the electrode pad 22 had to be larger in size than the bump electrode 14 to ensure the flatness of the passivation film 24. Thus, it has not been possible to utilize the area under the bump electrode 14, and, in turn, to reduce the size the semiconductor device itself.

Objects of the Invention

The present invention is developed to solve the above-described problem. In other words, an object of the present invention is to provide a semiconductor device and a semiconductor package for reducing the size of the semiconductor device without sacrificing the flatness of the passivation film, by utilizing the area under the bump electrode more effectively.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor device, having an electrode pad as a part of an uppermost wiring layer, includes a passivation film, which is formed on the electrode pad to have an opening therein; and a bump electrode for external connection, which is formed on the passivation film and is electrically connected to the electrode pad through the opening of the passivation film. The electrode pad is formed so as to be smaller in size than the bump electrode. A part of the uppermost wiring layer is formed under the bump electrode.

If there is only one wiring layer, the "uppermost wiring layer" herein means the single wiring layer itself. If there are a plurality of wiring layers, which are insulated from each other with inter-layer insulating films, the uppermost wiring layer means the wiring layer formed on the uppermost layer among those wiring layers.

According to a second aspect of the present invention, a semiconductor package, having the semiconductor device according to the first aspect of the present invention, is fabricated using a film carrier having a plurality of leads, which are held on an insulating film, and an end of each of the leads are connected to the bump electrode as an inner lead.

According to the present invention, an internal wiring can be arranged in an area where an electrode pad was conventionally formed, so that the chip size can be reduced. At the same time, the passivation film can be kept flat by certain formations of the internal wirings. Therefore, it is possible to prevent the manufacturing process from becoming complicated and the manufacturing cost from increasing, without providing a special design such as arranging dummy wirings under the bump electrode.

Because the passivation film is kept flat, the flatness of the bump electrode itself is improved, further improving the connection with the inner lead, which is connected with the bump electrode using a technology such as a thermal compression bonding process. Furthermore, it is possible to prevent a formation of a gap between the passivation film and the bump electrode, therefore, to reduce the risk of short circuit caused by a foreign substance getting into the gap.

Figure 1A:
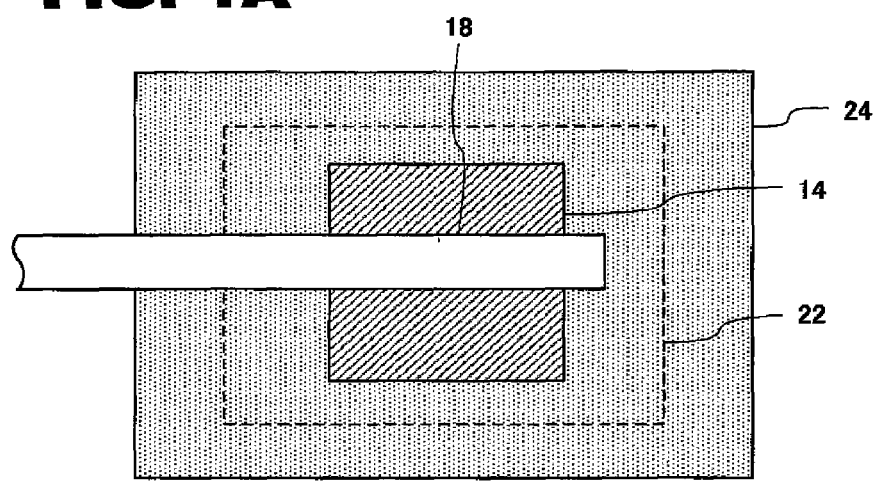
FIGS. 1A and 1B are a plan view and a cross-sectional view, respectively, of a conventional semiconductor device, showing a structure around a bump electrode thereof.
Figure 1B:
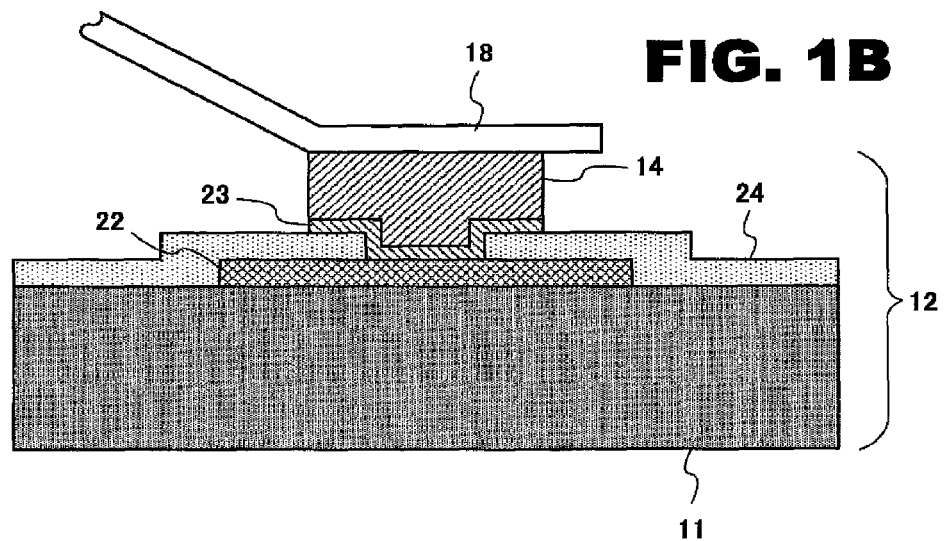

DESCRIPTIONS OF REFERENCE NUMERALS 100 semiconductor package
112 semiconductor device
114, 214, 314 bump electrode
118 inner lead
116 insulating film
120 resin member
122, 222, 322 electrode pad
123 under-bump metal
124, 224, 324 passivation film
130, 230, 330 internal wiring
232 power wiring

DETAILED DISCLOSURE OF THE INVENTION

In the following detailed description of the preferred embodiments, reference is made to the accompanying drawings which form a part thereof, and in which is shown by way of illustration specifically preferred embodiments in which the inventions may be practiced. These preferred embodiments are described in sufficient detail to enable those skilled in the art to practice the invention, and it is to be understood that other changes may be made without departing from the spirit and scope of the present inventions. The following detailed description is, therefore, not to be taken in a limiting sense, and scope of the present invention is defined only by the appended claims.

Figure 2:
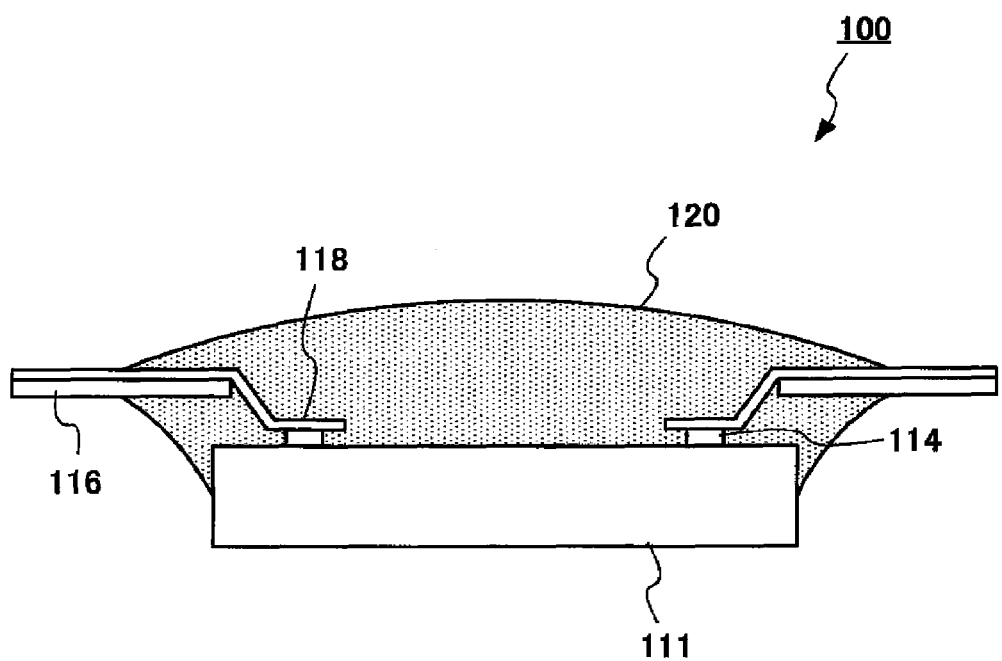
FIG. 2 is a side view of a semiconductor package related to the present invention.

FIG. 2 is a side view of a semiconductor package related to the present invention. A semiconductor package 100 includes a semiconductor device 112, a plurality of leads 118, and a resin member 120. The semiconductor device 112 is provided with a semiconductor chip 111 and electrode pads 122 (see FIGS. 3A and 3B). The semiconductor chip 111 further includes a plurality of wiring layers that are insulated from each other with inter-layer insulating films. The electrode pads 122 are provided as a part of the wirings on the uppermost wiring layer. The leads 118 are held on an insulating film 116. The resin member 120 is provided to protect the surface of the semiconductor device 112 and the inner lead 118. The semiconductor package having such structure is manufactured with a film carrier provided with the inner leads 118 to be connected with bump electrodes 114.

An example of the semiconductor chip 111 is an LCD driver chip. Some LCD driver chips are provided as a semiconductor integrated circuit (IC) having a plurality of semiconductor elements, and have a shape of a rectangle, whose side having the semiconductor IC is five or more times longer than other sides thereof. The semiconductor IC in the LCD driver chip, not shown diagrammatically, includes an inputting circuit, a memory such as Random Access Memory (RAM), a logic circuit, and an output circuit, and is configured so that each element operates in cooperation with the others. The logic circuit is formed with gate array, for example, and functions as a data processor. The output circuit includes a latch circuit, and is provided to output signals. The semiconductor chip 111 also includes a plurality of narrow-pitched bump electrodes that correspond to the input circuit and output circuit thereof. Especially for output circuit, the bump electrodes 114 are provided in a narrower-pitched array in a greater number.

The film carrier (116, 118) includes a plurality of leads 118 that are held on the insulating film 116. The film carrier also has a series of device holes, each of which exposes the leads 118 as an inner lead. Each of the inner leads 118 is connected to each of the bump electrodes 114 provided on the semiconductor device 112. A known TAB technology is used for the connection between the inner lead 118 and the bump electrode 114. In other words, the film carrier (116, 118) is conveyed for each device hole, and the semiconductor device 112 is aligned with a given position of the device hole. Subsequently, a set of the bump electrodes 114 and the inner leads 118 are bonded simultaneously with a bonding tool, using a technology such as a thermal compression bonding process. Then, the resin member 120 is formed to cover the edge of the semiconductor device 112 and the inner lead 118, including the nearby insulating film 116.

An example of the insulating film 116 is a polyimide film, and the thickness thereof should be equal or less than 100 μm, for example, in a range between 70 and 80 μm. The thickness of the leads 118 of insulting film 116 should be equal to or less than 30 μm, for example, in a range between 10 and 20 μm.

Figure 3A:
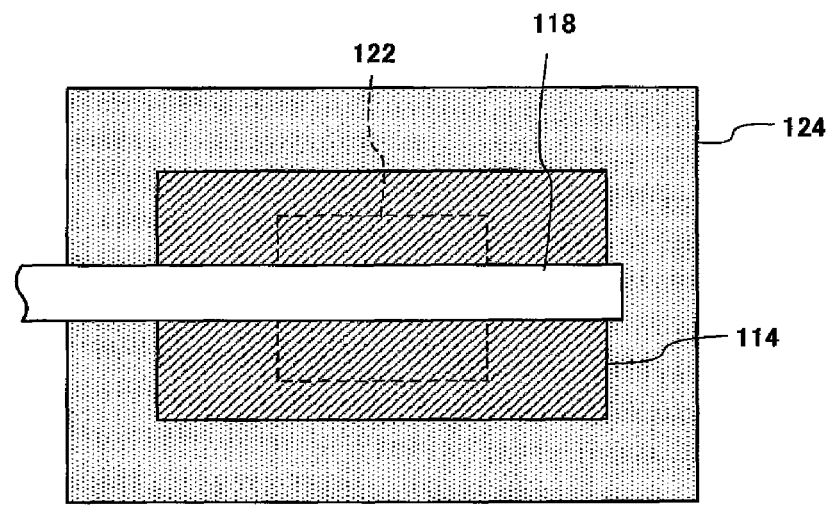
FIGS. 3A and 3B are a plan view and a cross-sectional view, respectively, of a semiconductor device according to a first embodiment of the present invention, showing a structure around a bump electrode thereof.
Figure 3B:
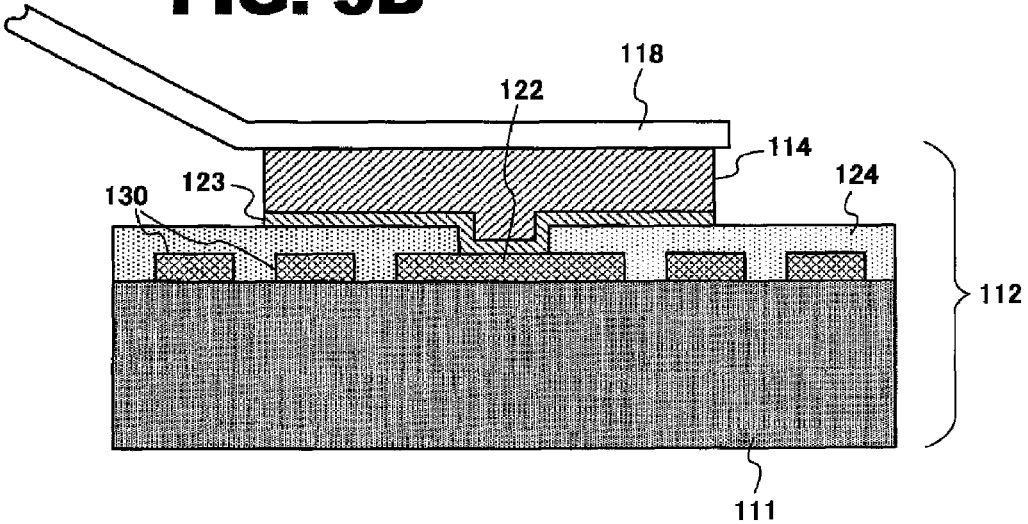
Figure 4:
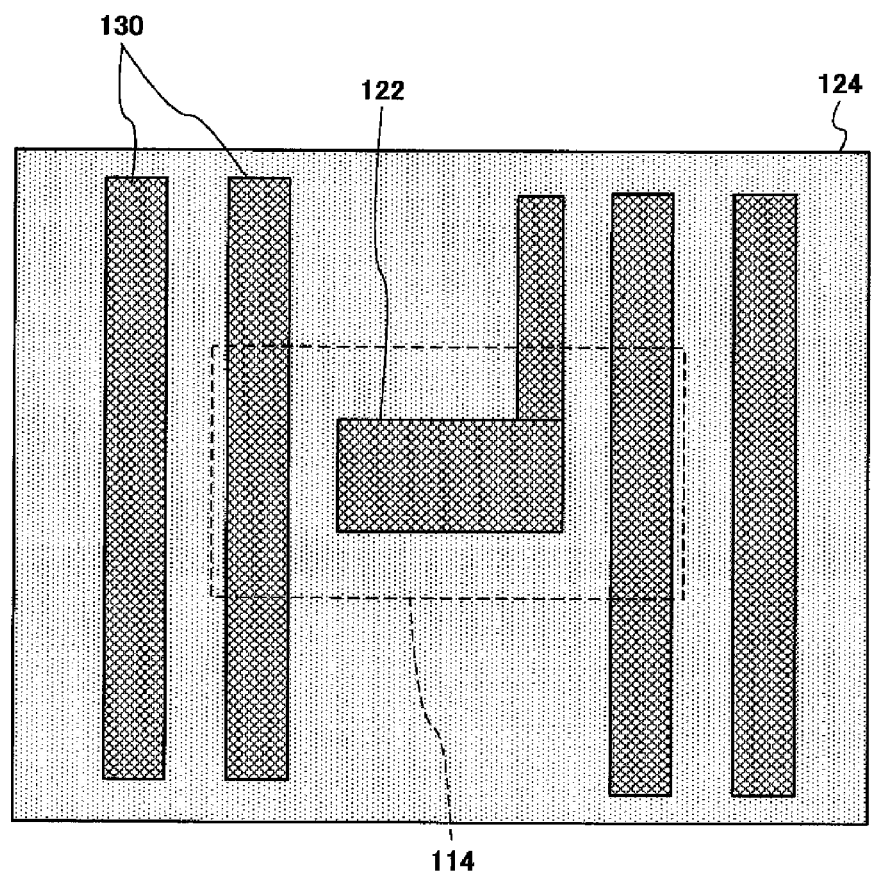
FIG. 4 is a plan view of the semiconductor device according to the first embodiment of the present invention, showing the structure around the bump electrode and the layout of the electrode pad and wirings provided under the bump electrode.

FIGS. 3A and 3B are a plan view and a cross-sectional view, respectively, of the semiconductor device 112 according to the first embodiment of the present invention, showing a structure around a bump electrode thereof. FIG. 4 is a plan view of the semiconductor device 112 according to the first embodiment of the present invention, showing the structure around the bump electrode and the layout of the electrode pad and wirings provided under the bump electrode. The semiconductor device 112 includes a passivation film 124; and a bump electrode 114 for external connection. The passivation film 124 is formed over the electrode pad 122, and has an opening. The bump electrode 114 is formed on the passivation film 124, and is electrically connected to the electrode pad 122 through the opening of the passivation film 124. Parts 130 of the wirings of the uppermost layer in the semiconductor chip 111 are provided under the bump electrode 114.

The passivation film 124 has an opening, which is smaller in size than the bump electrode 114, and is provided with an under-bump metal 123, which is connected to the electrode pad 122 through the opening thereof. The bump electrode 114 is connected to the electrode pad 122 via the under-bump metal 123. The inner lead 118, which is held on the film carrier, is connected onto the bump electrode 114 by a thermal compression bonding process.

The under-bump metal 123 may be made of a material such as nickel, Ti/Pt, or TiW/Au. The passivation film 124 may be made of a material such as oxidized film, nitride film, or polyimide. It is also possible to form a wafer coating over the passivation film 124, using a material such as polyimide. The electrode pad 122 may be made of a material such as Al, Al—Si, Al—Si—Cu, or Cu.

The bump electrode 114 may be made of a material such as gold, silver, copper, nickel, or solder. The bump electrode 114 may have a rectangle form, having the dimensions of 20 μm.times.60 μm to 50 μm.times.100 μm, for example. Distance between each bump should be equal to or greater than 10 μm, and bump pitch should be in a range from 30 to 60 μm.

To manufacture the bump electrode 114 made of gold, for example, the electrode pad 122 and the passivation film 124 are at first formed on a semiconductor substrate. Then, a barrier metal 123, made of TiW/Au laminate structure, is formed over the electrode pad 122 and the passivation film 124. Resist (not shown diagrammatically) is applied over the barrier metal 123 to form a resist pattern. The resist pattern is provided so as to have an opening at a given position on top of the electrode pad 122. Subsequently, gold plating is formed, following the resist pattern made using electrolytic plating. The resist pattern is then removed and excessive barrier metal 123 is removed from the passivation film 124 by etching, using the gold-plated shapes on the electrode pad 122 as a mask.

For embedding and flattening the multi-layer wiring of the semiconductor chip 111, TEOS (tetra-ethyl-ortho-silicate, tetraethoxysilane) film, or BPSG (boron-phosphorus-silicate-glass) film, PSG film or SOG film may be used for the inter-layer insulating film. The inter-layer insulating film can be formed with a thickness of 10000 Å using techniques such as CVD, sputtering, plasma-CVD, or coating.

According to the first embodiment of the present invention, the electrode pad 122 is formed to be smaller in size than the bump electrode 114. Because the smaller the size of the electrode pad 122 becomes, the greater the space available for wirings gets. With that, the internal wirings 130 can be provided under the bump electrode 114 on uppermost layer of the semiconductor chip 111. Because the internal wirings 130 are present, the passivation film 124 is kept flat. Furthermore, the flatness of the passivation film 124 is improved by arranging the internal wirings 130 regularly. Therefore, it is possible to prevent the manufacturing process from becoming complicated and the manufacturing cost from increasing, without providing a special design such as arranging dummy wirings under the bump electrode 114.

According to the first embodiment of the present invention, strips of the internal wirings 130 are arranged in a parallel fashion; however, the shape and direction thereof may be modified accordingly, depending on a function or other limitations of the semiconductor chip.

Figure 5:
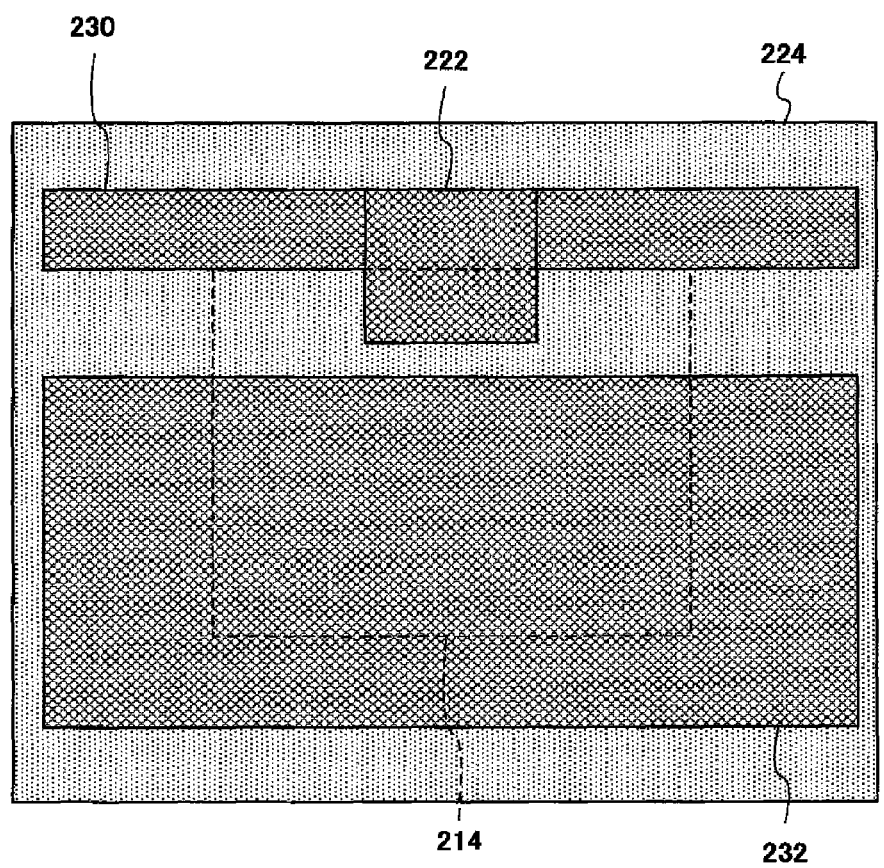
FIG. 5 is a plan view of the semiconductor device according to a second embodiment of the present invention, showing a structure around a bump electrode and a layout of an electrode pad and wirings provided under the bump electrode.

FIG. 5 is a plan view of the semiconductor device according to a second embodiment of the present invention, showing a structure around a bump electrode 214 and a layout of an electrode pad 222 and wirings 230, 232 provided under the bump electrode 214. According to the second embodiment of the present invention, the electrode pad 222 is not positioned directly below the bump electrode 214, but is positioned toward the edge. The wiring 230 is laid across the electrode pad 222. Because the electrode pad 222 is positioned toward the edge, a large space under the bump electrode 214 becomes available, so that a thick power wiring 232 is formed in this space. According to the second embodiment of the present invention, by arranging a thick wiring 232 under the passivation film 224, the flatness of the passivation film 224 is further improved.

Figure 6:
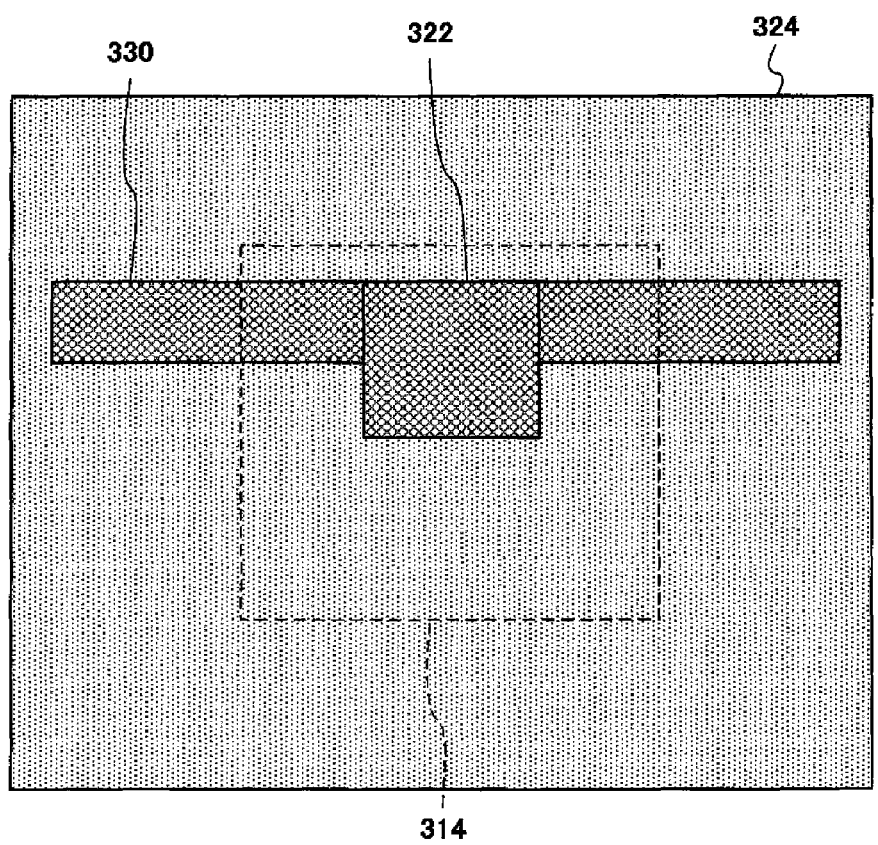
FIG. 6 is a plan view of the semiconductor device according to a third embodiment of the present invention, showing a structure around a bump electrode and a layout of an electrode pad and wirings provided under the bump electrode.

FIG. 6 is a plan view of the semiconductor device according to a third embodiment of the present invention, showing a structure around a bump electrode 314 and a layout of an electrode pad 322 and wiring 330 provided under the bump electrode 314. In this embodiment of the present invention, the electrode pad 322 is not positioned directly below the bump electrode 314, but is positioned toward the edge. The wiring 330 is laid across the electrode pad 322. The example according to the third embodiment of the present invention may be used when a passivation film 324 is not required to be highly flat upon forming the bump electrode 314.

The present invention is explained herein using the above preferred embodiments; however, these preferred embodiments are not intended to limit the scope of the present invention. The present invention may be modified in design within the scope of the technical concepts disclosed in the appended claims. For example, instead of the rectangle electrode, a bump electrode having a shape of a circle, an ellipsoid, or a triangle may also be used. The number of wiring layers does not affect the advantages of the present invention. Furthermore, the present invention may be applied not only to the LCD driver chip, but also to other various semiconductor devices that uses a bump electrode.

What is claimed is:

1. A semiconductor device, having an electrode pad as a part of a wiring, comprising:
    a passivation film, which is formed on the electrode pad to have an opening therein; and
    a bump electrode for external connection, which is formed on the passivation film and is electrically connected to the electrode pad through the opening of the passivation film,
    wherein the electrode pad is formed so as to have a surface area that is less than a surface area of the bump electrode in a plan view,
    in the plan view, the electrode pad is formed at a position shifted from a center of the bump electrode, thereby a space in which the electrode pad is not formed exists under the bump electrode,
    a part of the wiring is formed at least in the space under the bump electrode,
    wherein the wiring, including the electrode pad, has a width that is less than a length of a side of the electrode pad, and the electrode pad is formed so as to protrude in a horizontal direction from the wiring towards the center of the bump electrode, in which a center of the electrode pad is placed at a position closer to the wiring than the center of the bump electrode in the plan view, and
    wherein the wiring is connected to the electrode pad in a position that overlaps on both sides facing each other of the electrode pad in the horizontal direction in the plan view.

2. The semiconductor device according to claim 1, wherein the semiconductor device is a LCD driver chip.

3. The semiconductor device according to claim 1, wherein the part of the wiring formed in the space under the bump electrode is a power wiring.

4. The semiconductor device according to claim 2, wherein the part of the wiring formed in the space under the bump electrode is a power wiring.

5. The semiconductor device according to claim 1, wherein the bump electrode has a rectangular shape and the electrode pad overlaps with one side of the bump electrode.

6. The semiconductor device according to claim 5, wherein another side of the bump electrode overlaps with the wiring.

7. The semiconductor device according to claim 1, wherein the wiring is positioned directly below the bump electrode.

8. The semiconductor device according to claim 1, wherein the electrode pad is formed so as to be entirely overlapped by the bump electrode in the plan view.

9. The semiconductor device according to claim 1, wherein
the wiring comprises a first wiring that includes the electrode pad and a second wiring, and
the second wiring is formed so as to protrude outward from the bump electrode in the horizontal direction.

\* \* \* \* \*